(12) United States Patent
Visconti

(10) Patent No.: US 6,530,058 B1
(45) Date of Patent: Mar. 4, 2003

(54) METHOD FOR CORRECTION OF ERRORS IN A BINARY WORD STORED IN MULTILEVEL MEMORY CELLS, NOT REQUIRING ADDITIONAL CELLS

(75) Inventor: Angelo Visconti, Appiano Gentile (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/513,286

(22) Filed: Feb. 24, 2000

(30) Foreign Application Priority Data

Feb. 25, 1999 (EP) ............................................. 99830099

(51) Int. Cl.[7] ............................................. G11C 29/00
(52) U.S. Cl. ....................................... 714/773; 714/778
(58) Field of Search .................................. 714/773, 778

(56) References Cited

U.S. PATENT DOCUMENTS

| | | | |
|---|---|---|---|
| 5,122,688 A | | 6/1992 | Grimes ........................ 307/473 |
| 5,394,362 A | * | 2/1995 | Banks .................... 365/185.03 |
| 5,521,865 A | * | 5/1996 | Ohuchi et al. .......... 365/185.03 |
| 5,621,682 A | | 4/1997 | Tanzawa et al. ........ 365/185.03 |

\* cited by examiner

*Primary Examiner*—Stephen M. Baker
(74) *Attorney, Agent, or Firm*—Lisa K. Jorgenson; Robert Iannucci; Seed IP Law Group PLLC

(57) ABSTRACT

A method corrects the errors in a multilevel memory, by increasing the number of levels of the memory cells, instead of adding further memory cells. In other words, the present correction method is based on the principle of storing, in each multilevel memory cell, instead of a whole number b of bits in the binary word to be stored, data units which are correlated to this binary word, and are expressed in a numerical base other than binary, and not a power of two. This is carried out by converting the binary word with m bits to be stored, from the binary base, to a base n, which is not a power of two, and by associating with the converted word a correction word, which is also formed from digits with a base n; the digits of the converted and correction words are then each stored in a respective multilevel memory cell, with a number of levels which is equivalent to the numerical base used for the conversion. This makes it possible to reduce the number of multilevel memory cells used, and for specific values of in and n, the saving is such that the detection and correction of errors does not require multilevel memory cells in addition to the m/b multilevel memory cells which would be necessary for storing the m bits in the binary word.

19 Claims, 8 Drawing Sheets

| Four-level memory cells (n=4) | | | | | |
|---|---|---|---|---|---|
| Source word | | Correction word | Code Word | Cells Increase | |
| Bits | Cells | Cells | Cells | Abs. | % |
| 8 | 4 | 3 | 7 | +3 | +75 |
| 16 | 8 | 3 | 11 | +3 | +37,5 |
| 32 | 16 | 3 | 19 | +3 | +18,75 |
| 64 | 32 | 4 | 36 | +4 | +12,5 |
| 128 | 64 | 4 | 68 | +4 | +6,25 |

*FIG. 1*

| Five-level memory cells (n=5) | | | | | |
|---|---|---|---|---|---|
| Source word | | Correction word | Code word | Cells increase compared with n=4 | |
| Bits | Cells | Cells | Cells | Abs. | % |
| 8 | 4 | 2 | 6 | +2 | +50 |
| 16 | 7 | 3 | 10 | +2 | +25 |
| 32 | 14 | 3 | 17 | +1 | +6,25 |
| 64 | 28 | 4 | 32 | 0 | 0 |
| 128 | 56 | 4 | 60 | -4 | -6,25 |

*FIG. 2*

| Six-level memory cells (n=6) ||||||
|---|---|---|---|---|---|
| Source word || Correction word | Code word | Cells increase compared with n=4 ||
| Bits | Cells | Cells | Cells | Abs. | % |
| 8 | 4 | 2 | 6 | +2 | +50 |
| 16 | 7 | 3 | 10 | +2 | +25 |
| 32 | 13 | 3 | 16 | 0 | 0 |
| 64 | 25 | 3 | 28 | -4 | -12,5 |
| 128 | 50 | 4 | 54 | -10 | -15,62 |

*FIG. 3*

| CELL | 0 | | | | | 1 | | | | | 2 | | | | | 3 | | | | | 4 | | | | | 5 | | | | |
|---|---|---|---|---|---|---|---|---|---|---|---|---|---|---|---|---|---|---|---|---|---|---|---|---|---|---|---|---|---|---|
| LEVEL | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| INITIAL CORRECTION VECTORS V0 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| V1 | 0 | 1 | 2 | 3 | 4 | 0 | 0 | 0 | 0 | 0 | 0 | 1 | 2 | 3 | 4 | 0 | 0 | 0 | 0 | 0 | 0 | 1 | 2 | 3 | 4 | 0 | 0 | 0 | 0 | 0 |
| V2 | 0 | 0 | 0 | 0 | 0 | 0 | 1 | 2 | 3 | 4 | 0 | 1 | 2 | 3 | 4 | 0 | 0 | 0 | 0 | 0 | 0 | 0 | 0 | 0 | 0 | 0 | 1 | 2 | 3 | 4 |
| V3 | 0 | 0 | 0 | 0 | 0 | 0 | 0 | 0 | 0 | 0 | 0 | 0 | 0 | 0 | 0 | 0 | 1 | 2 | 3 | 4 | 0 | 1 | 2 | 3 | 4 | 0 | 1 | 2 | 3 | 4 |

| CELL | 6 | | | | | 7 | | | | | 8 | | | | | 9 | | | | | 10 | | | | | 11 | | | | |
|---|---|---|---|---|---|---|---|---|---|---|---|---|---|---|---|---|---|---|---|---|---|---|---|---|---|---|---|---|---|---|
| LEVEL | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| INITIAL CORRECTION VECTORS V0 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| V1 | 0 | 1 | 2 | 3 | 4 | 0 | 4 | 3 | 2 | 1 | 0 | 4 | 3 | 2 | 1 | 0 | 4 | 3 | 2 | 1 | 0 | 4 | 3 | 2 | 1 | 0 | 0 | 0 | 0 | 0 |
| V2 | 0 | 1 | 2 | 3 | 4 | 0 | 0 | 0 | 0 | 0 | 0 | 1 | 2 | 3 | 4 | 0 | 0 | 0 | 0 | 0 | 0 | 1 | 2 | 3 | 4 | 0 | 4 | 3 | 2 | 1 |
| V3 | 0 | 1 | 2 | 3 | 4 | 0 | 0 | 0 | 0 | 0 | 0 | 0 | 0 | 0 | 0 | 0 | 1 | 2 | 3 | 4 | 0 | 1 | 2 | 3 | 4 | 0 | 0 | 0 | 0 | 0 |

| CELL | 12 | | | | | 13 | | | | | 14 | | | | | 15 | | | | | 16 | | | | | 17 | | | | |
|---|---|---|---|---|---|---|---|---|---|---|---|---|---|---|---|---|---|---|---|---|---|---|---|---|---|---|---|---|---|---|
| LEVEL | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| INITIAL CORRECTION VECTORS V0 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| V1 | 0 | 1 | 2 | 3 | 4 | 0 | 0 | 0 | 0 | 0 | 0 | 1 | 2 | 3 | 4 | 0 | 0 | 0 | 0 | 0 | 0 | 1 | 2 | 3 | 4 | 0 | 0 | 0 | 0 | 0 |
| V2 | 0 | 4 | 3 | 2 | 1 | 0 | 4 | 3 | 2 | 1 | 0 | 4 | 3 | 2 | 1 | 0 | 0 | 0 | 0 | 0 | 0 | 0 | 0 | 0 | 0 | 0 | 1 | 2 | 3 | 4 |
| V3 | 0 | 0 | 0 | 0 | 0 | 0 | 1 | 2 | 3 | 4 | 0 | 1 | 2 | 3 | 4 | 0 | 4 | 3 | 2 | 1 | 0 | 4 | 3 | 2 | 1 | 0 | 4 | 3 | 2 | 1 |

| CELL | 18 | | | | | 19 | | | | | 20 | | | | | 21 | | | | | 22 | | | | | 23 | | | | |
|---|---|---|---|---|---|---|---|---|---|---|---|---|---|---|---|---|---|---|---|---|---|---|---|---|---|---|---|---|---|---|
| LEVEL | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| INITIAL CORRECTION VECTORS V0 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 | 0 | 1 | 2 | 3 | 4 |
| V1 | 0 | 1 | 2 | 3 | 4 | 0 | 2 | 4 | 1 | 3 | 0 | 2 | 4 | 1 | 3 | 0 | 2 | 4 | 1 | 3 | 0 | 2 | 4 | 1 | 3 | 0 | 0 | 0 | 0 | 0 |
| V2 | 0 | 1 | 2 | 3 | 4 | 0 | 0 | 0 | 0 | 0 | 0 | 1 | 2 | 3 | 4 | 0 | 0 | 0 | 0 | 0 | 0 | 1 | 2 | 3 | 4 | 0 | 2 | 4 | 1 | 3 |
| V3 | 0 | 4 | 3 | 2 | 1 | 0 | 0 | 0 | 0 | 0 | 0 | 0 | 0 | 0 | 0 | 0 | 1 | 2 | 3 | 4 | 0 | 1 | 2 | 3 | 4 | 0 | 0 | 0 | 0 | 0 |

| CELL | 24 | | | | | 25 | | | | | 26 | | | | | 27 | | | | |
|---|---|---|---|---|---|---|---|---|---|---|---|---|---|---|---|---|---|---|---|---|
| LEVEL | 0 | 1 | 2 | 3 | 4 | 0 | 1 | 2 | 3 | 4 | 0 | 1 | 2 | 3 | 4 | 0 | 1 | 2 | 3 | 4 |
| INITIAL CORRECTION VECTORS V0 | 0 | 1 | 2 | 3 | 4 | 0 | 1 | 2 | 3 | 4 | 0 | 1 | 2 | 3 | 4 | 0 | 1 | 2 | 3 | 4 |
| V1 | 0 | 1 | 2 | 3 | 4 | 0 | 0 | 0 | 0 | 0 | 0 | 1 | 2 | 3 | 4 | 0 | 0 | 0 | 0 | 0 |
| V2 | 0 | 2 | 4 | 1 | 3 | 0 | 2 | 4 | 1 | 3 | 0 | 2 | 4 | 1 | 3 | 0 | 0 | 0 | 0 | 0 |
| V3 | 0 | 0 | 0 | 0 | 0 | 0 | 1 | 2 | 3 | 4 | 0 | 1 | 2 | 3 | 4 | 0 | 2 | 4 | 1 | 3 |

*FIG. 6*

| Cell | 0 | 1 | 2 | 3 | 4 | 5 | 6 | 7 | 8 | 9 | 10 | 11 | 12 | 13 |
|------|---|---|---|---|---|---|---|---|---|---|----|----|----|----|
| V0   | X | X | X | X | X | X | X | X | X | X | X  | X  | X  | X  |
| V1   | X | O | X | O | X | O | X | Y | Y | Y | Y  | O  | X  | O  |
| V2   | O | X | X | O | O | X | X | O | X | O | X  | Y  | Y  | Y  |
| V3   | O | O | O | X | X | X | X | O | O | X | X  | O  | O  | X  |

| Cell | 14 | 15 | 16 | 17 | 18 | 19 | 20 | 21 | 22 | 23 | 24 | 25 | 26 | 27 |
|------|----|----|----|----|----|----|----|----|----|----|----|----|----|----|
| V0   | X  | X  | X  | X  | X  | X  | X  | X  | X  | X  | X  | X  | X  | X  |
| V1   | X  | O  | X  | O  | X  | Z  | Z  | Z  | Z  | O  | X  | O  | X  | O  |
| V2   | Y  | O  | O  | X  | X  | O  | X  | O  | X  | Z  | Z  | Z  | Z  | O  |
| V3   | X  | Y  | Y  | Y  | Y  | O  | O  | X  | X  | O  | O  | X  | X  | Z  |

FIG. 9

METHOD FOR CORRECTION OF ERRORS IN A BINARY WORD STORED IN MULTILEVEL MEMORY CELLS, NOT REQUIRING ADDITIONAL CELLS

TECHNICAL FIELD

The present invention relates to a method for correction of errors in a binary word stored in multilevel memory cells, not requiring additional cells.

BACKGROUND OF THE INVENTION

In order to detect and correct errors in a binary word with m bits, which is indicated hereinafter as the source word, techniques are known which are based on the addition of "redundancy" to the source word itself, i.e., which are based on the association of a binary word with k bits, which is indicated hereinafter as the correction word, with the source word, in which the k bits are obtained by carrying out k parity checks on k suitably selected sub-groups of the m bits in the source word.

This association is carried out in the so-called coding process, in which the $2^m$ possible source words which can be defined by means of m bits, are mapped in a set of an equivalent number of binary words of m+k bits, which are indicated hereinafter as the code words, each of which is obtained by placing one after the other a source word and the corresponding correction word.

The value of each of the k correction bits assigned during the coding process depends on the type of parity check carried out. For example, the values of the k correction bits can be assigned according to the so-called even parity checking criterion, i.e., to the bit in the i-th position in the correction word is assigned the logic value 0 or 1 according to whether in the i-th sub-group of the source word there is respectively an even or odd number of logic values 1, or the values can be assigned according to the so-called odd parity checking criterion, i.e., to the bit in the i-th position in the correction word is assigned the logic value 0 or 1 according to whether in the i-th sub-group there is respectively an odd or even number of logic values 1.

The decoding process, in which, on the base of a code word containing m+k bits stored, there is determination of the corresponding source word with m bits, with detection and correction of any errors which have been generated in it during the storage period, is carried out by executing once again the k parity checks on the bits in the source word, and comparing the correction word thus obtained with the correction word which is read by the memory, in order to generate a check word, which is also of the binary type, and indicates the position of the error(s) present in the source word, and on the base of which the error(s) present in the source word stored can be corrected.

Implementation of the correction techniques of the above-described type thus involves not only storage of the source words, but also storage of the correction words which are associated with them, and thus the use of additional memory cells.

This inevitably gives rise to an increase in the dimensions of the memory matrix, compared with those which are strictly necessary for storing only the source words, and thus to an undesirable increase in the space occupied by the memory matrix itself, on the wafer on which it is produced.

SUMMARY OF THE INVENTION

An embodiment of the present invention provides a method for correction of errors in a binary word stored in multilevel memory cells, not requiring the use of additional memory cells.

The method corrects the errors in a multilevel memory, by increasing the number of levels of the memory cells, instead of adding further memory cells. In other words, the method is based on the principle of storing, in each multilevel memory cell, instead of a whole number b of bits in the binary word to be stored, data units which are correlated to this binary word, and are expressed in a numerical base other than binary, and not a power of two. This is carried out by converting the binary word with m bits to be stored, from the binary base, to a base n, which is not a power of two, and by associating with the converted word a correction word, which is also formed from digits with a base n; the digits of the converted and correction words are then each stored in a respective multilevel memory cell, with a number of levels which is equivalent to the numerical base used for the conversion. This makes it possible to reduce the number of multilevel memory cells used, and for specific values of m and n, the saving is such that the detection and correction of errors does not require multilevel memory cells in addition to the m/b multilevel memory cells which would be necessary for storing the m bits in the binary word.

BRIEF DESCRIPTION OF THE DRAWINGS

In order to assist understanding of the present invention, a preferred embodiment is now described, purely by way of non-limiting example, with reference to the attached drawings which:

FIG. 1 shows a table which contains the number of four-level memory cells which are necessary for storing source words, correction words and code words, according to the length of the source words;

FIG. 2 shows a table which contains the number of five-level memory cells which are necessary for storing source words, correction words and code words, according to the length of the source words;

FIG. 3 shows a table which contains the number of six-level memory cells which are necessary for storing source words, correction words and code words, according to the length of the source words;

FIG. 6 shows a table which contains correction vectors which can be associated with the memory cells, in which the source words are stored, or are to be stored;

FIG. 9 shows a table containing check words which are used for the correction of errors.

DETAILED DESCRIPTION OF THE DRAWINGS

Figure 4:
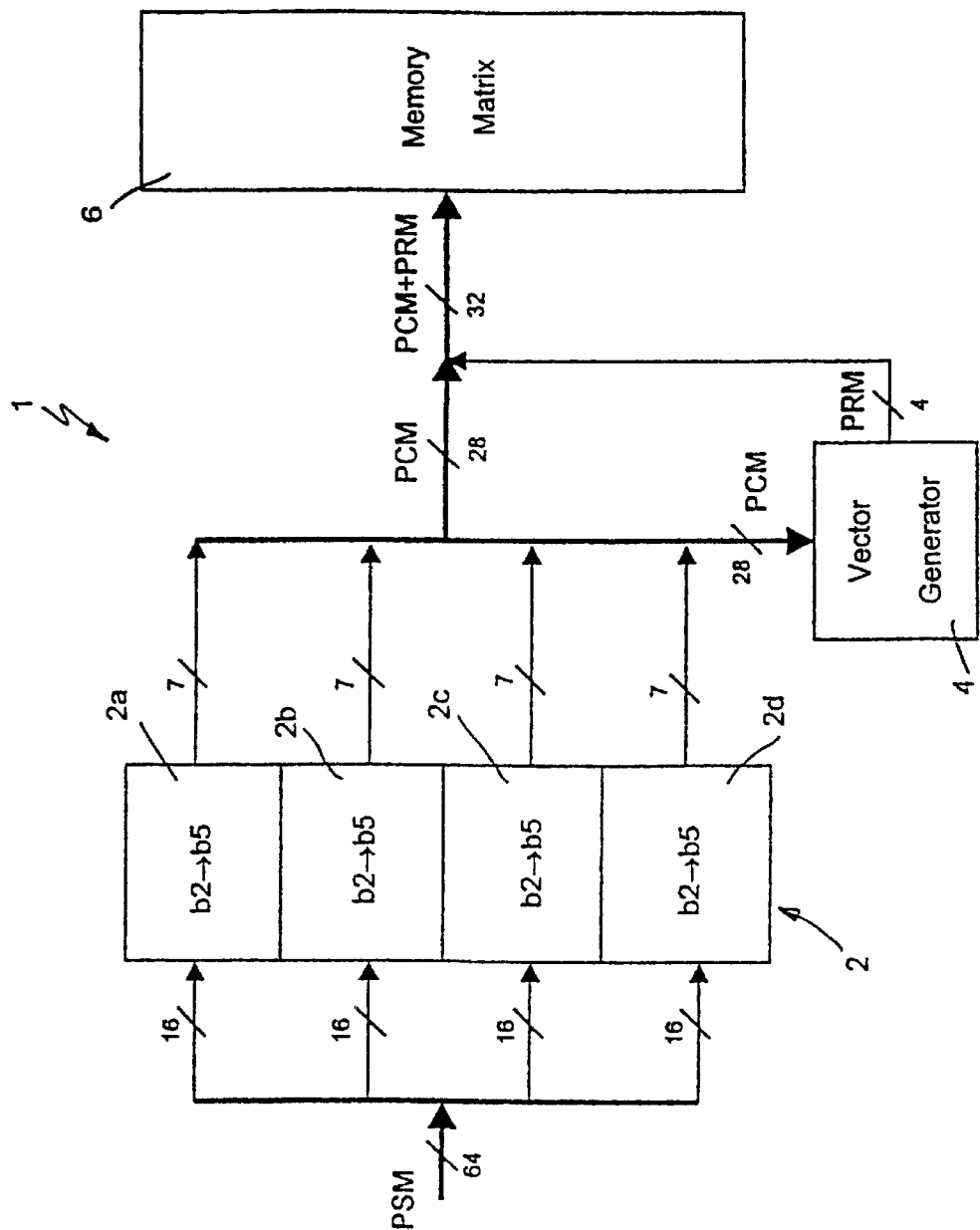
FIG. 4 shows a basic diagram of a writing section of binary words in a memory matrix, according to the present invention.

At present, storage of a source word with m bits in multilevel memory cells which have $2^b$ levels, in other words which can store b bits each, involves use of m/b memory cells, in each of which there is stored a whole number of bits of the source word.

In contrast, an embodiment of the present invention is a method for correction of the errors in a multilevel memory, by increasing the number of levels of the memory cells, instead of adding further memory cells.

In other words, the method stores in each multilevel memory cell, rather than a whole number b of bits of the source word, data units which are correlated to the source word itself, and expressed in a numerical base other than binary, and in particular a numerical base with a power other than two.

More specifically, the method carries out conversion of the source word with m bits, from the binary base, to any base n which is greater than two, and with a power other than two, in order to obtain a converted word formed by w digits, in which w is smaller than m/b. With the converted word, there is then associated a correction word, which is also formed by digits with a base of n, and each of the digits in the converted word and in the correction word is then stored in a respective multilevel memory cell, which has a number n of levels equivalent to the numerical base used for the conversion.

By this means, the number of multilevel memory cells with n levels, which are necessary for storing the converted word, is less than the number of multilevel memory cells with $2^b$ levels necessary for storing the source word from which this converted word is derived, and thus the memory cells saved can be used for storing the correction word necessary in order to detect and correct the error(s) caused by a generic malfunctioning of any of the multilevel memory cells in which the converted word is stored.

In particular, for specific values of n, and for source words which have specific lengths, the saving is such that the number of multilevel memory cells necessary for storing a converted word, and the respective correction word, can be equivalent to, or smaller than, that which is necessary for storing the source word alone, from which this converted word is derived.

In other words, by means of conversion of the source word, the detection and correction of the errors in the source word can be carried out without requiring additional multi-level memory cells, i.e., without requiring an increase in the dimensions of the memory matrix.

In detail, for storing a source with m bits, it is necessary to use a number r of memory cells with n levels, such that the following inequality is fulfilled:

$$n^r \geq 2^m$$

whereas in order to be able to detect and correct the error(s) generated by a defective multilevel memory cell from amongst the r memory cells with n levels which are used for storing a source word with m bits, it is necessary, but not sufficient, to add at least one number s of memory cells, such that the following inequality is fulfilled:

$$n^s \geq (n-1) \cdot (r+s)+1$$

By way of example, the table in FIG. 1 contains, for the most significant values of m, and for four-level memory cells (n=4), the number r of memory cells necessary for storing the source word, the number s of memory cells necessary for storing the correction word for a generic error, and the total number of memory cells necessary for storing the code word, as well as the increase, in absolute value and in percentile value, in the number of memory cells necessary for detecting and correcting these errors, relative to the number r of memory cells which is strictly necessary for storing the source word.

On the other hand, the tables in FIGS. 2 and 3 show the values of r and s, for memory cells with respectively five and six levels, as well as the increase in the number of memory cells which is necessary for detecting and correcting an error, relative to the number r of memory cells with four levels necessary for storing the source word.

By examining said tables, it can be seen that in the case of use of five-level memory cells, and for source words which have a length of 64 bits or more, the number of memory cells which is necessary for storing the source words and the corresponding correction words, is equivalent to, or less than, that which is necessary for storing the source words alone, using four-level memory cells.

Similarly, it can also be seen that in the case of use of six-level memory cells, and for source words which have a length of 32 bits or more, the number of memory cells which is necessary for storing the source words and the corresponding correction words, is equivalent to, or less than, that which is necessary for storing the source words alone, using four-level memory cells.

FIG. 4 illustrates a circuit scheme of a writing section according to the present invention, used for storing source words. In particular, FIG. 4 illustrates a writing section of 64-bit source words in a memory matrix which consists of five-level memory cells (n=5).

As illustrated in FIG. 4, the writing section, which is generally indicated as 1, comprises a converter stage 2 carrying out conversion from the binary base to the numerical base 5; the converter stage 2 receives at the input the source word to be stored, indicated as PSM, and supplies at the output a converted word to be stored, indicated as PCM, which consists of 28 digits with a base of 5.

In particular, since the operation of conversion from the binary base to the base of 5 can be carried out more easily by subdividing the 64-bit source word into four separate 16-bit source sub-words, and converting each of these source sub-words, the converter stage 2 comprises four conversion sub-stages 2a, 2b, 2c, 2d, each of which receives at the input a respective 16-bit source sub-word with a base of 2, and supplies at the output a respective converted sub-word consisting of 7 digits with a base of 5.

It should be emphasized that since the conversion operation is carried out using circuitry which is designed for operations of a binary type, a digit with a base of 5 will in fact be represented by 3 bits, and thus each converted sub-word which is supplied by the conversion sub-stages will consist of 7 groups of three bits, which constitute the binary representations of the 7 digits with a base of 5.

Thus, for the sake of simplicity in the following description, reference will be made only to digits with a base of 5, on the understanding that in reality, in the place of the latter there are present the respective binary representations, except for the representations stored in the multi-level memory matrix 6, which are not binary.

The writing section 1 also comprises a correction word generator stage 4 receiving at the input the converted word PCM, and supplying at the output a correction word PRM, consisting of 4 digits with a base of 5. The converted word PCM and the correction word PRM are then supplied to the memory matrix 6, in order to be stored.

In particular, each digit in the converted word PCM, and in the correction word PRM, is stored in a respective 5-level memory cell, and there is programmed into the latter a threshold voltage value which belongs to one of the five predetermined intervals, i.e., there is stored in the floating gate region of the memory cell an electric charge value which belongs to one of the five predetermined intervals.

Figure 5:
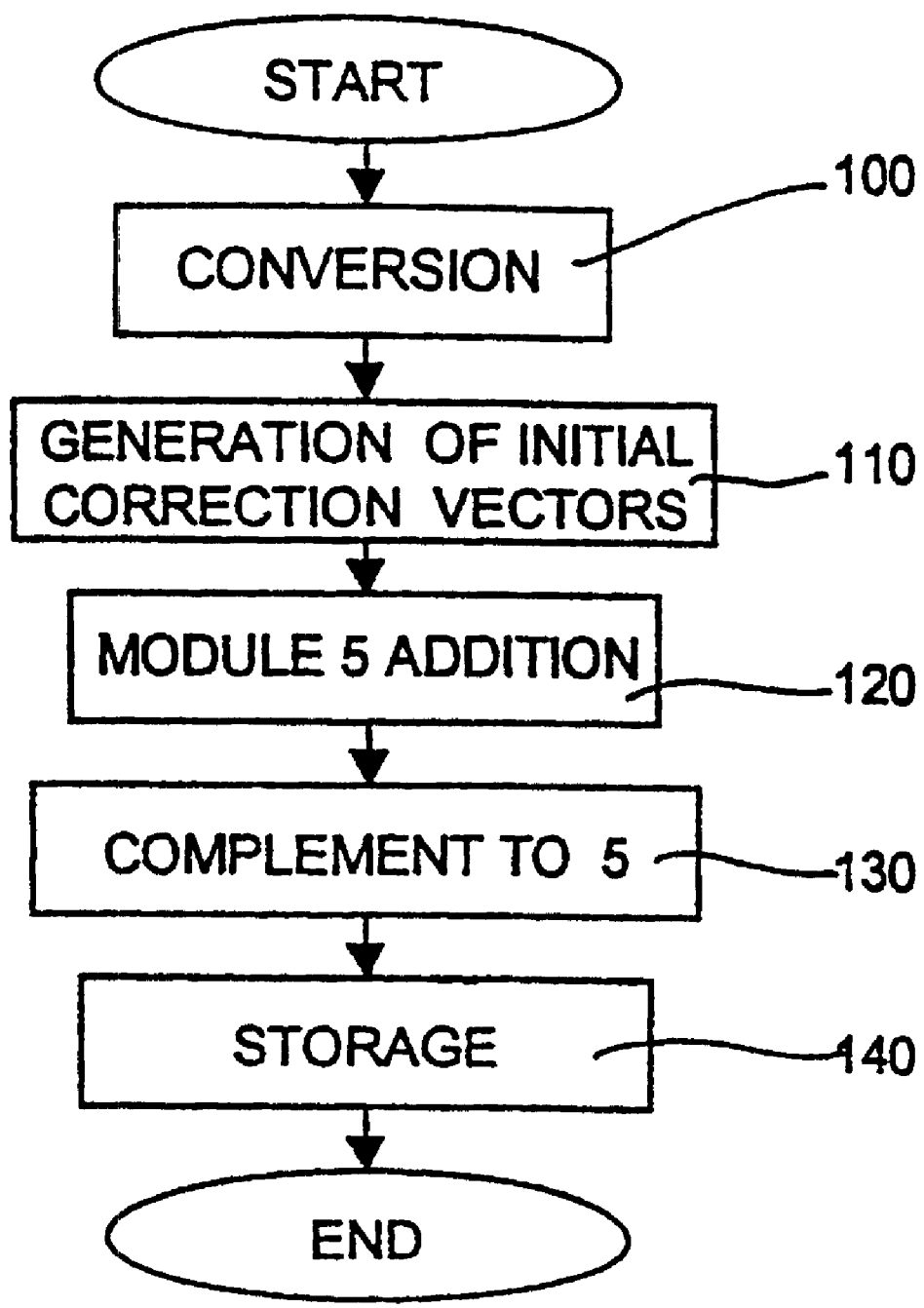
FIG. 5 shows a flow chart of operations carried out for generation of correction words, during writing of binary words in a memory matrix according to the present invention.

FIG. 5 illustrates a flow chart relative to the operations carried out by the writing section 1 for storing a source word PSM in the memory matrix 6.

As illustrated in FIG. 5, initially, the converter stage 2 converts the source word PSM from the binary base into the numerical base of 5, thus generating at the output the converted word PCM, which is supplied to the correction vector generator stage 4 (block 100).

Subsequently, the correction word generator stage 4 generates 28 initial correction vectors VI, consisting of 4 digits with a base of 5, one for each of the 28 memory cells necessary for storage of the converted word (block 110).

The table in FIG. 6 contains an example of initial correction vectors VI, which can be generated by the correction word generator stage 4 for each of the memory cells. In particular, the table in FIG. 6 shows the five initial correction vectors VI which can be generated for each of the memory cells, according to the level which can be programmed in them.

Subsequently, the correction word generator stage 4 adds in module 5 the digits which are located in corresponding positions (indicated in the table in FIG. 6 respectively as V0, V1, V2 and V3) of the 28 initial correction vectors VI, thus providing an addition correction vector VS, which also consists of 4 digits with a base of 5 (block 120).

The correction word generator stage 4 then calculates the complement to 5 of the addition correction vector VS, and supplies at the output a correction word PRM, which consists of 4 digits with a base of 5 (block 130).

The converted word PCM which is generated by the converter stage 2, and the correction word PRM which is generated by the correction vector generator stage 4, are then supplied to the memory matrix 6 in order to be stored (block 140).

Figure 7:
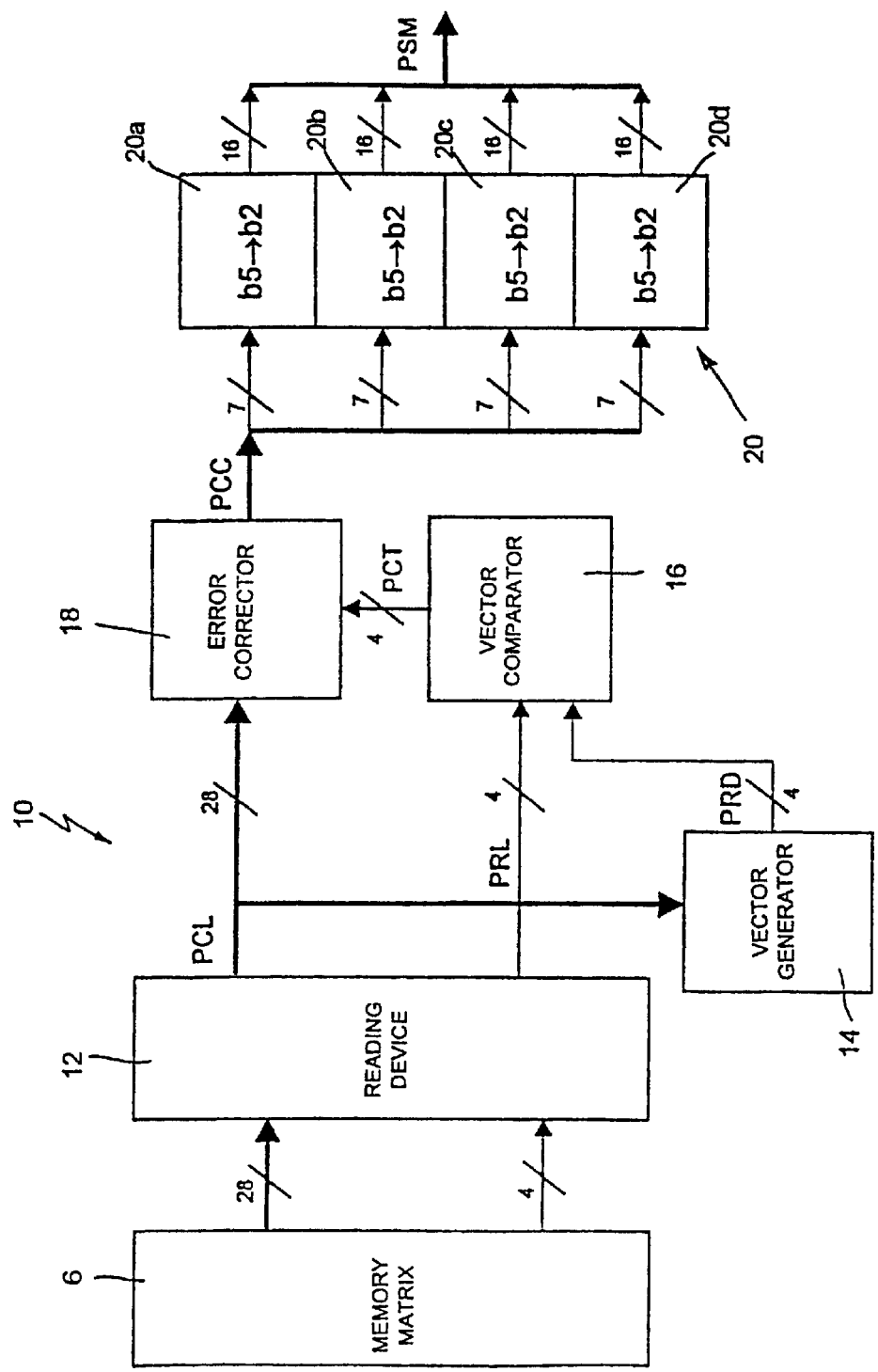
FIG. 7 shows a basic diagram of a reading section of binary words, in a memory matrix according to the present invention.

The reading of a converted word, and of the corresponding correction word stored in the memory matrix 6, is carried out by using a reading section, the circuit scheme of which is illustrated in FIG. 7.

As illustrated in FIG. 7, the reading section, which is generally indicated as 10, comprises a reading device (or sense amplifier) 12, which is connected to the memory matrix 6, and supplies at the output a read converted word PCL, and a respective read correction word PRL; a correction word generator stage 14 identical to the correction word generator stage 4 of the writing section 1, receiving at the input the read converted word PCL and supplying at the output a correction word PRD formed by 4 digits with a base of 5; a comparator stage 16 receiving at the input the correction words PRL and PRD, and supplying at the output a check word PCT formed by 4 digits with a base of 5, and indicative of the presence, the position and the correction of any errors present in the read converted word PCL; an error correction stage 18 receiving at the input the read converted word PCL and the check word PCT, and supplying at the output a corrected converted word PCC; and a converter stage 20 carrying out a conversion from the numerical base of 5 to the binary base, receiving at the input the corrected converted word PCC, and supplying at the output the source word PSM stored, which is formed by 64 bits with a base of 2.

Similarly to the description given for the converter stage 2, the converter stage 20 comprises four conversion sub-stages 20a, 20b, 20c, 20d, each of which receives at the input a respective corrected converted sub-word of 7 digits with a base of 5, and supplies at the output a respective 16-bit source sub-word with a base of 2.

Figure 8:
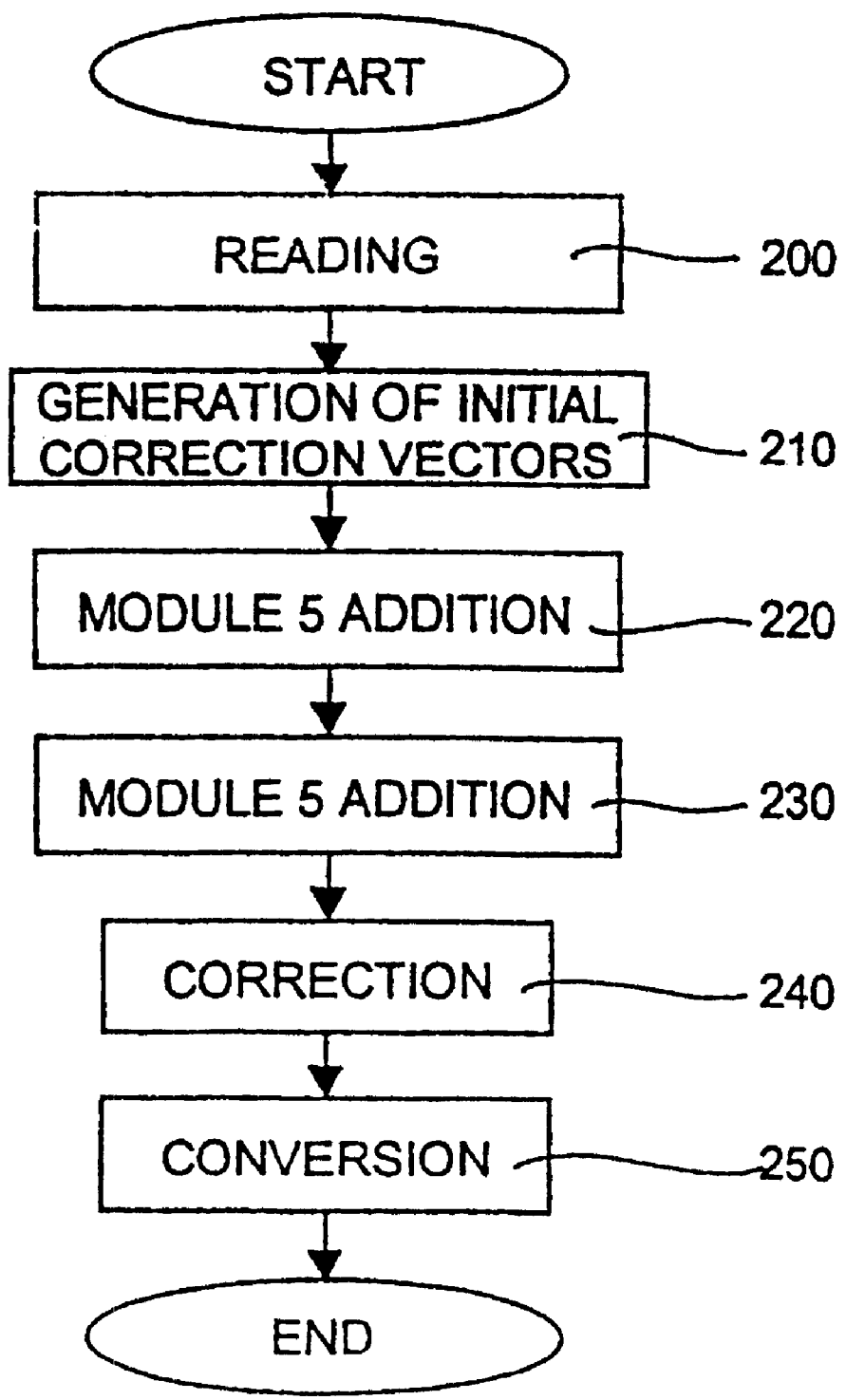
FIG. 8 shows a flow chart of operations carried out for generation of correction words, during reading of binary words in a memory matrix according to the present invention.

FIG. 8 illustrates a flow chart relative to the operations carried out by the reading section 10 for reading in the memory matrix 6 a converted word and the respective correction word.

As illustrated in FIG. 8, initially the reading device 12 reads in the memory and supplies at the output the read converted word PCL, which is supplied both to the correction word generator stage 14 and to the error correction stage 18, and the corresponding read correction word PRL, which is supplied to the comparator stage 16 (block 200).

Subsequently, the correction word generator stage 14 generates 28 initial correction vectors VI, formed by 4 digits with a base of 5, one for each of the 28 memory cells in which the converted word to be read is stored (block 210).

In particular, the 28 initial correction vectors VI generated in reading must be identical to those generated in writing, and thus in the example in question, they are those which are specified in the table in FIG. 6.

Subsequently, the correction word generator stage 14 adds in module 5 the digits which are located in corresponding positions (V0, V1, V2 and V3) in the 28 initial correction vectors VI, thus providing a correction word PRD, which is formed by 4 digits with a base of 5 (block 220).

Subsequently, the correction word PRD is supplied to the comparator stage 16, which adds in module 5 the digits which are located in corresponding positions in the correction word PRL and in the correction word PRD, thus providing a check word PCT, which is also formed by 4 digits with a base of 5 (block 230).

The check word PCT is then supplied to the error correction stage 18, which carries out the correction of the converted word, according to the following criterion (block 240):

if all the digits in the check word are equivalent to zero, the 28 digits in the read converted word PCL are not affected by errors (or there are at least two incorrect digits which, for the reasons stated, the present method cannot correct);

if only one of the digits in the check word is other than zero, one of the digits in the read correction word PRL is incorrect, and thus the 28 digits in the read converted word PCL are not affected by errors;

if two or more digits in the check word are other than zero, one of the digits in the read converted word PCL is incorrect, and thus the error correction stage 18 generates a corrected converted word PCC, on the base of the information contained in the check word.

In particular, the selection of the initial correction vectors shown in the table in FIG. 6 means that if there is an error in one of the digits in the read converted word PCL, the first digit in the check word is always other than zero, and constitutes the value to be subtracted from the incorrect digit in the read converted word PCL, in order to obtain the correct value, whereas the other three digits in the check word identify the position of the incorrect digit within the read converted word PCL, i.e., the position of the faulty memory cell from amongst the 28 memory cells used for storage of the converted word, according to the coding contained in the table in FIG. 9.

In particular, in FIG. 9, the columns of the table contain the check words which are associated with the 28 memory cells, in which the letters X, Y and Z represent digits which are different from one another, and can assume the values 1, 2, 3 and 4, and thus this table defines a relationship between the various combinations of the values which the digits in the check word can assume, and respective positions in the digits in the read converted word PCL (and thus in the memory cells in which the converted word is stored).

The corrected converted word PCC formed by 28 digits with a base of 5, is then re-converted from the conversion stage 20, into a 64-bit source word with a base of 2, by carrying out four conversion operations on four corrected converted sub-words, each of which is formed by 7 digits with a base of 5 (block 250).

The advantages of the present correction method are apparent from the foregoing description.

In particular, the present method makes it possible to implement in multilevel memories error correction codes which do not require an increase in the size of the memory matrix.

Finally, it is apparent that modifications and variants can be made to the correction method described and illustrated here, without departing from the protective context of the present invention.

I claim:

1. Method for correction of errors in a word to be stored in multilevel memory cells by carrying out a process of coding a binary word to be stored, comprising the steps of:
   a) converting said binary word from a binary base to a different numerical base n, which is not a power of two, in order to generate a converted word, which is formed by a plurality of digits with a base n;
   b) generating a correction word as a function of said converted word, said correction word being formed by a plurality of digits with a base n; and
   c) storing each digit of said converted word and of said correction word, in a respective multilevel memory cell, which has a number of levels which is equivalent to said different numerical base.

2. Method according to claim 1, wherein step b) comprises the steps of:
   b1) generating a plurality of initial correction vectors, formed by digits with a base n, one for each of the memory cells used for storage of said converted word; and
   b2) generating said correction word as a function of said plurality of initial correction vectors.

3. Method according to claim 2, wherein step b2) comprises the steps of:
   b21) determining an addition correction vector, which is formed by digits with a base n, as a function of said initial correction vectors; and
   b22) calculating the complement, with a base n, of said addition correction vector.

4. Method according to claim 3, wherein step b21) comprises the steps of adding, in module n, the digits which are located in corresponding positions in said initial correction vectors.

5. Method for correction of errors in a word stored in multilevel memory cells, the method comprising the step of decoding a first converted word and a first correction word formed by digits with a numerical base n which is other than the binary base, and is not a power of two, which are stored in multilevel memory cells with a number of levels which is equivalent to said different numerical base, the decoding step including the steps of:
   d) reading said first converted word and said first correction word stored in said multilevel memory cells;
   e) generating a second correction word as a function of said first converted word;
   f) generating a check word, which is indicative of the presence, position and correction of any errors in said first converted word, as a function of said first and second correction words;
   g) correcting said first converted word, as a function of said check word, in order to generate a second converted word; and
   h) converting said second converted word from said different numerical base n, to said binary base, in order to generate a source word of a binary type.

6. Method according to claim 5, wherein step e) comprises the steps of:
   e1) generating a plurality of initial correction vectors formed by digits with a base n, one for each of the memory cells in which said first converted word is stored; and
   e2) generating said second correction word as a function of said plurality of initial correction vectors.

7. Method according to claim 6, wherein step e2) comprises the step of adding, in module n, of the digits which are located in corresponding positions in said initial correction vectors.

8. Method according to claim 5 wherein step f) comprises the step of:
   f1) addition, in module n, of the digits located in corresponding positions in said first and second correction word.

9. Method according to claim 5 wherein step g) comprises the steps of:
   g1) detecting an absence of errors in said first converted word, if all the digits in said check word are equivalent to a predetermined value;
   g2) detecting a presence of an error in said first correction word, and an absence of an error in said first converted word, if a single one of the digits in said check word is other than said predetermined value; and
   g3) detecting a presence of an error in one of the digits in said first converted word, if two or more digits in said check word are other than said predetermined value.

10. Method according to claim 9, wherein, in the event of detection of an error in one of the digits in said first converted word, said step g) additionally comprises the steps of:
    g4) determining the position of the incorrect digit within said first converted word using a first set of digits in said check word, and an association table, which defines a relationship between combinations of values of the digits in said first set, and respective positions of the digits in said first converted word; and
    g5) correcting the incorrect digit in said first converted word, using a second set of digits in said check word.

11. Method according to claim 10, wherein step g5) additionally comprises the step of:
    g51) correcting the incorrect digit in said first converted word, using a first digit in said check word; wherein said step g4) additionally comprises the step of:
    g41) determining the position of the incorrect digit within said first converted word, using the remaining digits in said check word.

12. Method according to claim 11, wherein step g51) comprises the step of subtracting said first digit of said check word from said incorrect digit in said first converted word.

13. An error-correcting memory system, comprising:
    a matrix of multilevel memory cells for storing a converted word and a correction word, each of the memory cells having a plural number of levels n, which is not a power of two, the converted word and correction word each including a plurality of digits of base n, each digit being stored in a respective one of the memory cells;
    a converter having an output coupled to the matrix and an input that receive a binary word, the converter being structured to convert the binary word from base 2 to base n and thereby generate the converted word at the output;

a vector generator having an input coupled to the output of the converter and an output coupled to the matrix, the vector generator being structured to generate the correction word as a function of the converted word.

14. The memory system of claim 13 wherein the converter includes a plurality of converter stages, each converter stage having an input the receives a respective sub-word of the binary word and an output at which a respective sub-word of the converted word is produced.

15. An error-correcting memory system, comprising:

a matrix of multilevel memory cells for storing a first converted word and a first correction word, each of the memory cells having a plural number of levels n, which is not a power of two, the converted word and correction word each including a plurality of digits of base n, each digit being stored in a respective one of the memory cells;

a vector generator coupled to the matrix and structured to generate a second correction word as a function of the first converted word;

a vector comparator coupled to the matrix and to the vector generator, the vector comparator being structured to generate a check word, which is indicative of the presence, position and correction of any errors in the first converted word, as a function of the first and second correction words;

an error corrector coupled to the memory matrix and the vector comparator, the error corrector being structured to correct the first converted word, as a function of the check word, and thereby generate a second converted word; and a converter coupled to the error corrector and structured to convert the second converted word from base n to base 2 to form a binary source word.

16. The memory system of claim 15 wherein the vector generator includes:

means for generating a plurality of initial correction vectors formed by digits of base n, one for each of the memory cells in which the first converted word is stored; and means for generating the second correction word as a function of the plurality of initial correction vectors.

17. The memory system of claim 15 wherein the error corrector includes:

means for detecting an absence of errors in the first converted word, if all the digits in the check word equal a predetermined value;

means for detecting a presence of an error in the first correction word, and an absence of an error in the first converted word, if a single one of the digits in the check word is other than the predetermined value; and means for detecting a presence of an error in one of the digits in the first converted word, if two or more digits in the check word are other than the predetermined value.

18. The memory system of claim 17 wherein the error corrector includes:

means for, in the event of detection of an error in one of the digits in the first converted word, determining the position of the incorrect digit within the first converted word, using a first set of digits in the check word, and an association table, which defines a relationship between combinations of values of the digits in the first set, and respective positions of the digits in the first converted word; and means for correcting the incorrect digit in the first converted word, using a second set of digits in the check word.

19. The memory system of claim 17 wherein the error corrector includes:

means for correcting the incorrect digit in the first converted word, using a first digit in the check word; and means for determining the position of the incorrect digit within the first converted word, using the remaining digits in the check word.

* * * * *

UNITED STATES PATENT AND TRADEMARK OFFICE
CERTIFICATE OF CORRECTION

PATENT NO. : 6,530,058 B1
DATED : March 4, 2003
INVENTOR(S) : Angelo Visconti

It is certified that error appears in the above-identified patent and that said Letters Patent is hereby corrected as shown below:

<u>Title page,</u>
Item [57], ABSTRACT,
Line 18, "values of in and n," should be corrected to read as -- values of m and n, --.

Signed and Sealed this

Second Day of September, 2003

JAMES E. ROGAN
*Director of the United States Patent and Trademark Office*